(12) United States Patent
Zhang et al.

(10) Patent No.: US 11,483,010 B2
(45) Date of Patent: Oct. 25, 2022

(54) OUTPUT CONTROL CIRCUIT, METHOD FOR TRANSMITTING DATA AND ELECTRONIC DEVICE

(71) Applicant: BOE TECHNOLOGY GROUP CO., LTD., Beijing (CN)

(72) Inventors: Junrui Zhang, Beijing (CN); Xuehui Zhu, Beijing (CN); Ronghua Lan, Beijing (CN); Xin Xiang, Beijing (CN); Xiaoqiao Liu, Beijing (CN); Xizhu Peng, Beijing (CN); He Tang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 162 days.

(21) Appl. No.: 17/095,606

(22) Filed: Nov. 11, 2020

(65) Prior Publication Data

US 2021/0152184 A1 May 20, 2021

(30) Foreign Application Priority Data

Nov. 15, 2019 (CN) .......................... 201911126421.8

(51) Int. Cl.
*H03M 9/00* (2006.01)
(52) U.S. Cl.
CPC ..................... *H03M 9/00* (2013.01)
(58) Field of Classification Search
CPC ................................. H03M 9/00; H03K 19/01
See application file for complete search history.

(56) References Cited

U.S. PATENT DOCUMENTS

| | | | | |
|---|---|---|---|---|
| 5,266,937 A | * | 11/1993 | DiSanto | G09G 3/3446 345/84 |
| 2001/0003429 A1 | * | 6/2001 | Maeda | G11C 7/106 326/93 |
| 2003/0090451 A1 | * | 5/2003 | Ahn | G09G 3/3688 345/96 |
| 2007/0217499 A1 | * | 9/2007 | Limberg | H04B 1/68 375/240 |

(Continued)

FOREIGN PATENT DOCUMENTS

CN 103297055 A * 9/2013

*Primary Examiner* — Farley Abad
(74) *Attorney, Agent, or Firm* — Kinney & Lange, P.A.

(57) ABSTRACT

An output control circuit, a method for transmitting data, and an electronic device are disclosed. The output control circuit includes: a serial-to-parallel conversion circuit configured to obtain at least one group of parallel data through a serial-to-parallel conversion; an intermediate-stage cache circuit configured to divide the at least one group of parallel data into at least two categories of subgroup parallel data according to sequence of serial-to-parallel conversion; a latch output circuit including a plurality of latch arrays each of which receiving any category of subgroup parallel data and latching and outputting any subgroup parallel data in any category of subgroup parallel data; and a selection control circuit configured to, within an effective pulse duration of the any subgroup parallel data, control a latch array for the any subgroup parallel data in the plurality of latch arrays to latch and output the any subgroup parallel data.

10 Claims, 12 Drawing Sheets

(56) References Cited

U.S. PATENT DOCUMENTS

| | | | |
|---|---|---|---|
| 2011/0016288 A1* | 1/2011 | Chang | G06F 9/30149 |
| | | | 711/E12.078 |
| 2011/0239080 A1* | 9/2011 | Sakaue | H03M 13/116 |
| | | | 714/752 |
| 2011/0298957 A1* | 12/2011 | Kim | H04N 5/376 |
| | | | 348/308 |

* cited by examiner

OUTPUT CONTROL CIRCUIT, METHOD FOR TRANSMITTING DATA AND ELECTRONIC DEVICE

CROSS-REFERENCE TO RELATED APPLICATION

This application claims the benefit of Chinese Patent Application No. 201911126421.8 filed on Nov. 15, 2019, the whole disclosure of which is incorporated herein by reference.

TECHNICAL FIELD

The present disclosure relates to a field of control technology, and in particular to an output control circuit, a method for transmitting data, and an electronic device.

BACKGROUND

In complex control, a large number of processes for transmitting data is often involved. In order to correctly implement data transmission, a reasonable output control circuit is required. If a logic function and a circuit structure of the output control circuit are unreasonable, a sequence dislocation may occur and the data transmission cannot be completed correctly.

SUMMARY

The embodiments of the present disclosure provide an output control circuit, a method for transmitting data, and an electronic device.

According to an aspect of the present disclosure, there is provided an output control circuit, comprising: a serial-to-parallel conversion circuit, an intermediate-stage cache circuit, a latch output circuit, and a selection control circuit coupled in sequence; wherein the serial-to-parallel conversion circuit is configured to perform a serial-to-parallel conversion on input serial data to obtain at least one group of parallel data; the intermediate-stage cache circuit is configured to receive the at least one group of parallel data, and divide the at least one group of parallel data into at least two categories of subgroup parallel data according to sequence of serial-to-parallel conversion in the serial-to-parallel conversion circuit, and cache the at least two categories of subgroup parallel data; the latch output circuit comprises a plurality of latch arrays, and each of the plurality of latch arrays is configured to receive any one of the at least two categories of subgroup parallel data, and latch and output any subgroup parallel data in any category of subgroup parallel data; and the selection control circuit is configured to, within effective pulse duration of the any subgroup parallel data, control a latch array for the any subgroup parallel data in the plurality of latch arrays to latch and output the any subgroup parallel data.

In an example, the serial-to-parallel conversion circuit comprises: a sampling signal generator comprising M output terminals configured to output M sampling pulse signals whose effective pulse edges differ from each other by a first set time in sequence; and M first latches coupled in parallel each of which comprising a first input terminal, a second input terminal, and an output terminal; first input terminals of the M first latches are configured to receive the serial data, and a second input terminal of an $m^{th}$ first latch in the M first latches is electrically coupled to an $m^{th}$ output terminal in the M output terminals of the sampling signal generator; the $m^{th}$ first latch is configured to latch and output an $m^{th}$ bit of data in any M-bit sequence in the serial data based on an $m^{th}$ sampling pulse signal output from the $m^{th}$ output terminal, and an output terminal of the $m^{th}$ first latch outputs the $m^{th}$ bit of data in a group of parallel data for any M-bit sequence; wherein M is an integer greater than 1, and m is an integer greater than or equal to 1 and less than or equal to M.

In an example, the intermediate-stage cache circuit comprises: M second latches, wherein the M second latches are divided into P second latch groups, and a $p^{th}$ second latch group in the P second latch groups comprises a $\{[(p-1)\times M/P]+1\}^{th}$ second latch to a $(p\times M/P)^{th}$ second latch in the M second latches; wherein each of the M second latches comprises a first input terminal, a second input terminal, and an output terminal, and a first input terminal of an $m^{th}$ second latch in the M second latches is electrically coupled to an output terminal of the $m^{th}$ first latch; second input terminals of the M second latches are configured to receive a clock signal; output terminals of M/P second latches in the $p^{th}$ second latch group are configured to output a $p^{th}$ category of subgroup parallel data in the at least two categories of subgroup parallel data; wherein P is an integer greater than 1, p is an integer greater than or equal to 1 and less than or equal to P, and M is divisible by P.

In an example, the plurality of latch arrays comprises P×N latch arrays, the P×N latch arrays are divided into P latch array groups, a $p^{th}$ latch array group in the P latch array groups comprises N latch arrays, and each of the P×N latch arrays comprises a first input terminal, a second input terminal, and an output terminal; wherein output terminals of the M/P second latches in the $p^{th}$ second latch group are electrically coupled to a first input terminal of the N latch arrays in the $p^{th}$ latch array group; wherein N is a positive integer, and when the serial data comprises X-bit data, N=X/M, wherein X is an integer greater than 1.

In an example, when m=p×M/P, second input terminals of the M/P second latches in the pth second latch group are electrically coupled to the mth output terminal of the sampling signal generator.

In an example, the selection control circuit comprises: a plurality of switching circuits; and a ring counter configured to, within effective pulse duration of the any subgroup parallel data, control a switching circuit for the any subgroup parallel data in the plurality of switching circuits to output a control signal, and control a latch array for the any subgroup parallel data in the plurality of latch arrays to latch and output the any subgroup parallel data by using the control signal.

In an example, the plurality of switching circuits comprise P×N switching circuits, each of the P×N switching circuits comprises a first input terminal, a second input terminal, and an output terminal; the ring counter comprises N stages of third latches coupled in cascade, each of the N stages of third latches comprises a first input terminal, a second input terminal, and an output terminal, an $n^{th}$ stage of third latch in the N stages of third latches is configured to control P switching circuits; an effective pulse edge of a clock signal received by a second input terminal of the $n^{th}$ stage of third latch differs from an effective pulse edge of a clock signal received by a second input terminal of the $(n+1)^{th}$ stage of third latch by a second set time; an output terminal of the $n^{th}$ stage of third latch is electrically coupled to a first input terminal of the $(n+1)^{th}$ stage of third latch, and second input terminals of the P switching circuits controlled by the $n^{th}$ stage of third latch; an output terminal of a $p^{th}$ switching circuit in the P switching circuits controlled by the $n^{th}$ stage of third latch is electrically coupled to a second input terminal of the n$^{th}$ latch array in the N latch arrays in the p$^{th}$ latch array group; a first input terminal of the switching circuit is configured to receive a clock signal; and effective pulse edges of two clock signals received by first input terminals of any two adjacent switching circuits differ from each other by a third set time; wherein n is an integer greater than or equal to 1 and less than or equal to N.

In an example, at least one of the first latch, the second latch, and the third latch is a D-type latch.

According to an aspect of the present disclosure, there is provided a method for transmitting data, comprising: transmitting serial data to be transmitted to the output control circuit according to claim 1, wherein the serial-to-parallel conversion circuit performs a serial-to-parallel conversion on the serial data to obtain at least one group of parallel data; the intermediate-stage cache circuit receives the at least one group of parallel data, and divides the at least one group of parallel data into at least two categories of subgroup parallel data according to sequence of serial-to-parallel conversion in the serial-to-parallel conversion circuit, and caches the at least two categories of subgroup parallel data; each of the plurality of latch arrays receives any one of the at least two categories of subgroup parallel data; and the selection control circuit controls a latch array for the any subgroup parallel data in the plurality of latch arrays to latch and output the any subgroup parallel data within effective pulse duration of the any subgroup parallel data in any category of subgroup parallel data.

According to an aspect of the present disclosure, there is provided an electronic device comprising the output control circuit according to embodiments of the present disclosure.

BRIEF DESCRIPTION OF THE DRAWINGS

In order to illustrate embodiments of the present disclosure or traditional technical solutions more clearly, the accompanying drawings used in descriptions of the embodiments will be introduced briefly in the following. Obviously, the accompanying drawings in the following descriptions are only some embodiments of the present disclosure. For those of ordinary skill in the art, other drawings can be obtained from these accompanying drawings without creative work, in which.

DETAILED DESCRIPTION OF EMBODIMENTS

Figure 1:
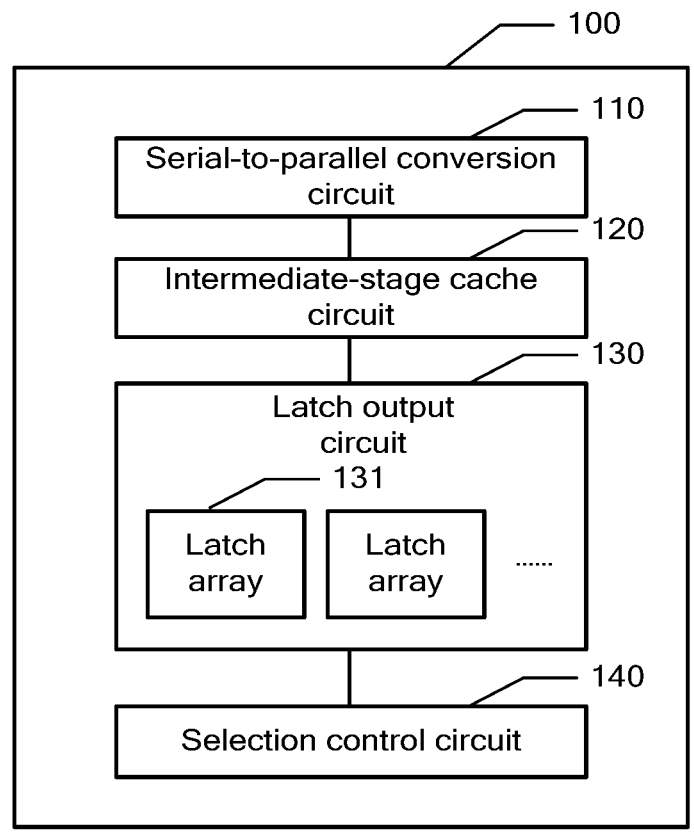
FIG. 1 schematically shows a block diagram of an output control circuit according to an embodiment of the present disclosure.

In order to make objectives, technical solutions and advantages of the embodiments of the present disclosure clearer, the technical solutions in the embodiments of the present disclosure will be described clearly and completely in conjunction with the accompanying drawings in the embodiments of the present disclosure. Obviously, the described embodiments are part of the embodiments of the present disclosure, but not all of them. Based on the described embodiments of the present disclosure, all other embodiments obtained by those of ordinary skill in the art without creative labor are within the protection scope of the present disclosure. It should be noted that throughout the drawings, the same elements are represented by the same or similar reference numbers. In the following descriptions, some specific embodiments are only used for descriptive purposes, and should not be construed as limiting the present disclosure, but are merely examples of the embodiments of the present disclosure.

When it may cause confusion in the understanding of the present disclosure, conventional structures or configurations will be omitted. It should be noted that the shape and size of each component in the drawings do not reflect the actual size and scale, but merely illustrates the content of the embodiments of the present disclosure.

Unless otherwise defined, the technical or scientific terms used in the embodiments of the present disclosure should have usual meanings understood by those skilled in the art. The "first", "second" and similar words used in the embodiments of the present disclosure do not indicate any order, quantity, or importance, but are only used to distinguish different components.

In addition, in the descriptions of the embodiments of the present disclosure, the term "coupled" or "coupled to" may mean that two components are directly coupled, or that two components are coupled via one or more other components. In addition, these two components can be connected or coupled by wired or wireless means.

In the descriptions of the embodiments of the present disclosure, the term "an effective pulse edge" refers to a pulse edge that can trigger related devices to perform operations based on the pulse edge. In some embodiments, a rising edge of a pulse signal may be used to trigger related devices to perform operations, thus the rising edge of the pulse signal is the effective pulse edge. In other embodiments, a falling edge of a pulse signal may be used to trigger related devices to perform operations, thus the falling edge of the pulse signal is the effective pulse edge.

In the descriptions of the embodiments of the present disclosure, the term "an effective level" refers to a level of a signal that enables a device that performs operations based on the level to perform operations. In some embodiments, the device may perform operations based on a high level, thus the high level is the effective level. In other embodiments, the effective level may also be a low level.

In addition, in the descriptions of the embodiments of the present disclosure, the term "effective pulse duration" refers to a duration period of the effective level.

In a process of a data transmission, it is necessary to use a sequential logic circuit that controls a data output, herein it is called "an output control circuit". For example, in a scenario for transmitting data between a sending terminal and a receiving terminal, the sending terminal transmits serial data to be transmitted to the output control circuit, and the output control circuit processes the serial data, and outputs a processing result to the receiving terminal. Herein, the sending terminal and the receiving terminal may be independent devices, or different modules, devices, components and the like in the same device. The output control circuit may be provided independently of the sending terminal and the receiving terminal, or may be provided in the sending terminal or in the receiving terminal, which is no limited here.

A design of an output control circuit is to use a shift register to perform a serial and parallel conversion (hereinafter referred as "serial-to-parallel conversion") on serial data, and output parallel data shifted by the shift register. As an operation principle of the shift register for serial-to-parallel conversion is to sequentially shift input data to obtain parallel data under control of a clock signal, the parallel data for the serial data, obtained by the shift register, is synchronous and effective pulse duration is only 1 initial clock cycle. Therefore, a time redundancy for the output control circuit based on this design to read parallel data from the shift register to the output terminal is only 1 initial clock cycle, and in a case where wiring in the circuit are long, a sequence dislocation may occur due to delay, and the data transmission may not be completed correctly.

FIG. 1 schematically shows a block diagram of an output control circuit 100 according to an embodiment of the present disclosure.

As shown in FIG. 1, the output control circuit 100 may include a serial-to-parallel conversion circuit 110, an intermediate-stage cache circuit 120, a latch output circuit 130, and a selection control circuit 140 coupled in sequence.

The serial-to-parallel conversion circuit 110 is configured to perform a serial-to-parallel conversion on input serial data to obtain at least one group of parallel data. Herein, a data length of the input serial data may be an integer multiple of a data width of any group of parallel data. Each data in any group of parallel data is not obtained by synchronous conversion, but has a sequence of the serial-to-parallel conversion. For example, in a case where a group of parallel data with a data width of 4 bits is needed, the sequence of the serial-to-parallel conversion may be: a serial-to-parallel conversion on a $1^{st}$ bit of data in the 4-bit data is firstly performed, and then a serial-to-parallel conversion on a $2^{nd}$ bit of data in the 4-bit data is performed, then a serial-to-parallel conversion on a $3^{rd}$ bit of data in the 4-bit data is performed, and finally a serial-to-parallel conversion on a $4^{th}$ bit of data in the 4-bit data is performed. In other examples, the serial-to-parallel conversion circuit 110 may perform serial-to-parallel conversion operations in other sequences, thereby obtaining parallel data with various data widths, which is not limited herein. It should be noted that "parallel data" in the present disclosure refers to an effective parallel data for the input serial data, rather than any data output in parallel.

The intermediate-stage cache circuit 120 is configured to receive the at least one group of parallel data, and divide the at least one group of parallel data into at least two categories of subgroup parallel data according to the sequence of serial-to-parallel conversion in the serial-to-parallel conversion circuit 110, and cache the at least two categories of subgroup parallel data. Each group of parallel data may be divided into at least two categories of subgroup parallel data according to the sequence of serial-to-parallel conversion. Exemplarily, with respect to above example where a group of parallel data with a data width of 4 bits is needed, the $1^{st}$ bit of data and the $2^{nd}$ bit of data that complete the serial-to-parallel conversion earlier may constitute a first category of subgroup parallel data, and the $3^{rd}$ bit of data and the $4^{th}$ bit of data that complete the serial-to-parallel conversion later may constitute a second category of subgroup parallel data. In this example, the intermediate-stage cache circuit 120 may cache the first category of subgroup parallel data just after the serial-to-parallel conversion of the $2^{nd}$ bit of data is completed for a subsequent latch output circuit 130 to output, without waiting for completion of the serial-to-parallel conversion of the $3^{rd}$ bit of data and the 4th bit of data. Then, the intermediate-stage cache circuit 120 may cache the second category of subgroup parallel data after the serial-to-parallel conversion of the $4^{th}$ bit of data is completed for the subsequent latch output circuit 130 to output.

The latch output circuit 130 may include a plurality of latch arrays 131, each of the plurality of latch arrays includes one or more latches, and each latch array 131 is configured to receive any one of the at least two categories of subgroup parallel data, and latch and output any subgroup parallel data in any category of subgroup parallel data. Exemplarily, in above example, each group of parallel data is divided into two categories of subgroup parallel data. If the serial-to-parallel conversion circuit 120 obtains 3 groups of parallel data, then during an output control process in which the output control circuit 100 exerting control on the input serial data, the first category of subgroup parallel data includes 3 subgroups of parallel data, and the second category of subgroup parallel data includes 3 subgroups of parallel data. Each latch array 131 in the latch output circuit 130 may be configured to receive a first category of subgroup parallel data, or to receive a second category of subgroup parallel data, and each latch array 131 latches and outputs a subgroup parallel data of any category of subgroup parallel data received under control of the selection control circuit 140.

The selection control circuit 140 may be configured to control the latch array 131 for the any subgroup parallel data in the plurality of latch arrays 131, to latch and output the any subgroup parallel data, within effective pulse duration of any subgroup parallel data. When the subgroup parallel data includes multiple bits of data, the effective pulse duration of the subgroup parallel data is an overlap interval of the effective pulse duration of multiple bits of data. Different categories of subgroup parallel data are output through different latch arrays 131, and output processes of different categories of subgroup parallel data do not affect each other.

Those skilled in the art may understand that according to the output control circuit 100 designed in an embodiment of the present disclosure, the serial-to-parallel conversion circuit 110 asynchronously completes the serial-to-parallel conversion of each bit of data in the serial data, and by cooperating with the serial-to-parallel conversion circuit 110, the intermediate-stage cache circuit 120 caches the different categories of subgroup parallel data belonging to the same group of parallel data according to the sequence of serial-to-parallel conversion in the serial-to-parallel conversion circuit 110. The latch output circuit 130 latches and outputs different categories of subgroup parallel data through different latch arrays 131 under control of the selection control circuit 140. This circuit design minimizes an impact on the serial-to-parallel conversion processes among different categories of subgroup parallel data and an impact on the latch and output processes, so that effective pulse duration of one subgroup parallel data may theoretically be continued from a time when the subgroup parallel data completes the serial-to-parallel conversion to a time when next subgroup parallel data in the same category completes the serial-to-parallel conversion. Therefore, the effective pulse duration of each subgroup parallel data is much longer than 1 initial clock cycle, which significantly increases a time redundancy of the output control circuit, and improves accuracy of the data transmission.

It may be understood that a data length of the serial data, number of groups of parallel data, a data width of the parallel data, number of categories obtained by dividing each group of parallel data, and the like in above examples are only exemplary descriptions, and may be chosen and set based on actual requirements, which is not limited here.

A working principle of the serial-to-parallel conversion circuit according to an embodiment of the present disclosure will be exemplarily described below with reference to FIGS. 2A, 2B, 3A, and 3B.

Figure 2A:
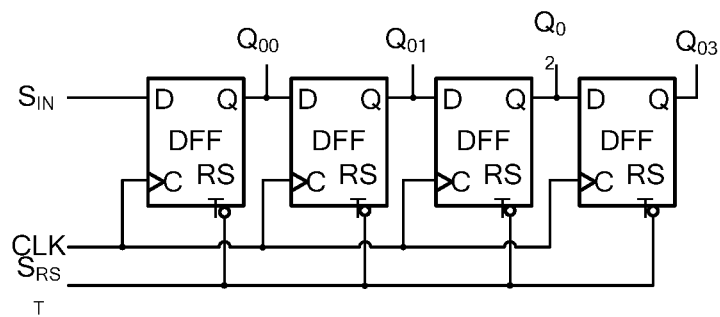
FIG. 2A schematically shows an example block diagram of a shift register of an output control circuit in a design manner.
Figure 2B:
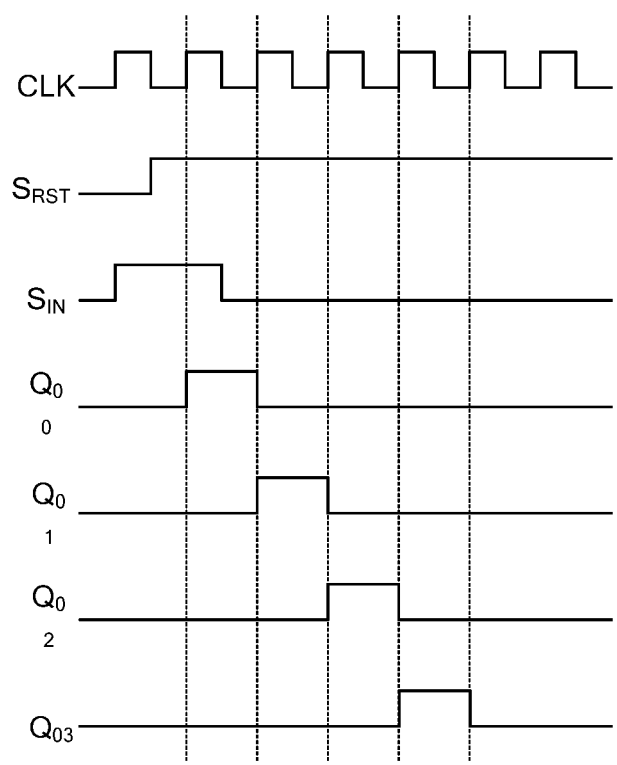
FIG. 2B schematically shows a timing diagram of the shift register shown in FIG. 2A.

FIG. 2A schematically shows an example block diagram of a shift register of an output control circuit in a design manner. FIG. 2B schematically shows a timing diagram of the shift register shown in FIG. 2A.

A design uses a shift register for a serial-to-parallel conversion. A circuit shown in FIG. 2A is a 4-bit shift register composed of 4 cascaded edge-triggered D flip-flops (abbreviated as DFF), in which an input terminal D of the first flip-flop receives the serial data $S_{IN}$, an input terminal D of each of the flip-flops remained is electrically coupled to an output terminal of a previous-stage flip-flop. A trigger terminal C of each flip-flop receives an initial clock signal CLK. A reset terminal RST of each flip-flop receives a reset signal $S_{RST}$.

FIG. 2B shows a timing diagram of the shift register. Each bit of data in the serial data $S_{IN}$ is sequentially shifted into the shift register according to the sequence of transmission time, and each effective pulse edge of the initial clock signal CLK will shift the data in the shift register by 1 bit to the right. For example, the serial data $S_{IN}$ includes 4 bits of data. After 4 effective pulse edges, all the 4 bits of input serial data are shifted into the shift register, and parallel data is obtained at the output terminals of the 4 flip-flops within duration of the fifth effective pulse of an initial clock signal CLK as shown in FIG. 2B. When a next effective pulse of the initial clock signal CLK arrives, the parallel data may change due to the data shift. Therefore, the effective pulse duration of the parallel data for the serial data $S_{IN}$ is only 1 initial clock cycle, and subsequent output operations may only be performed in this 1 initial clock cycle, thus errors are likely to occur during data transmission. Also, because outputs ($Q_{00}$~$Q_{03}$) of the 4 D flip-flops are always in a dynamic shift process, parallel data may not be divided into sub-parts for output processing.

Figure 3A:
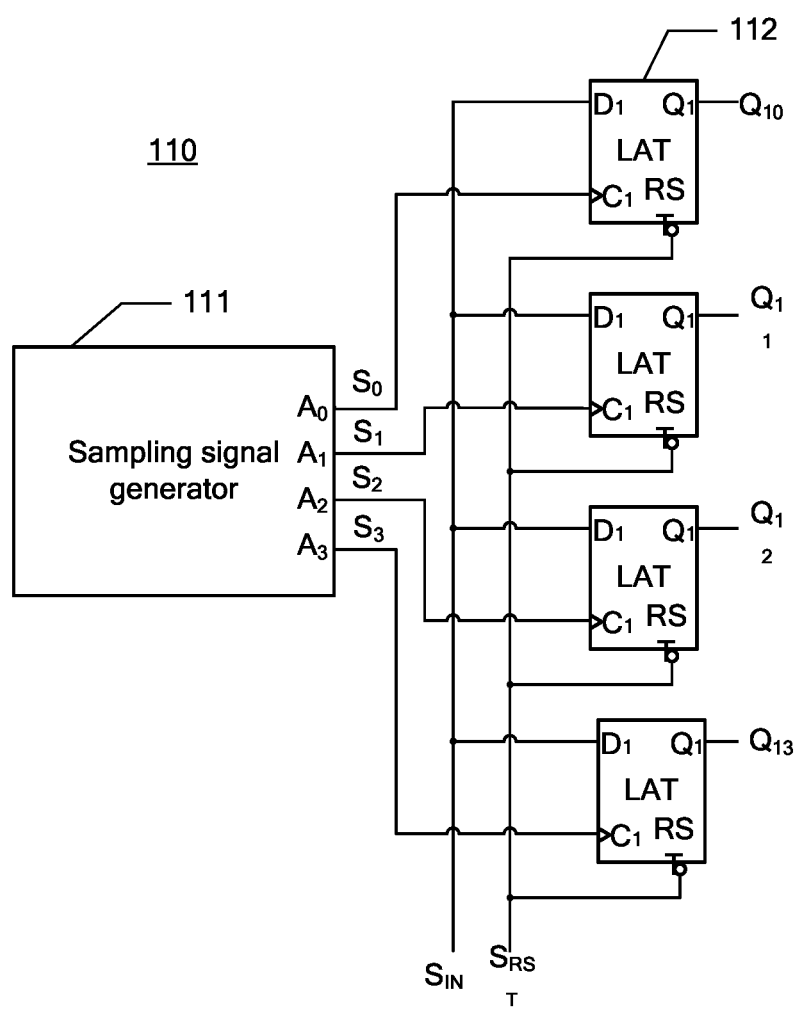
FIG. 3A schematically shows an example block diagram of a serial-to-parallel conversion circuit shown in FIG. 1 according to an embodiment of the present disclosure.

FIG. 3A schematically shows an example block diagram of the serial-to-parallel conversion circuit 110 shown in FIG. 1 according to an embodiment of the present disclosure.

As shown in FIG. 3A, the serial-to-parallel conversion circuit 110 may include a sampling signal generator 111, and M first latches (abbreviated as LAT) 112 coupled in parallel.

The sampling signal generator 111 includes M output terminals ($A_0$~$A_{M-1}$), and the M output terminals ($A_0$~$A_{M-1}$) are configured to respectively output M sampling pulse signals ($S_0$~$S_{M-1}$) whose effective pulse edges differ from each other by a first set time in sequence. Each of the M first latches 112 includes a first input terminal $D_1$, a second input terminal $C_1$, and an output terminal $Q_1$. All first input terminals $D_1$ are configured to receive the serial data $S_{IN}$ to be transmitted. A second input terminal $C_1$ of an $m^{th}$ first latch 112 in the M first latches 112 is electrically coupled to an $m^{th}$ output terminal $A_{m-1}$ of the sampling signal generator 111. The $m^{th}$ first latch 112 is configured to latch and output an $m^{th}$ bit of data in any M-bit sequence in the serial data $S_{IN}$ to be transmitted based on an $m^{th}$ sampling pulse signal $S_{m-1}$ output by the sampling signal generator 111. An output terminal $Q_1$ of the $m^{th}$ first latch 112 outputs the $m^{th}$ bit of data in a group of parallel data $Q_{1(m-1)}$ for any of M-bit sequences mentioned above. Herein, M is an integer greater than 1, and m is an integer greater than or equal to 1 and less than or equal to M.

In order to facilitate descriptions of the working principle of the serial-to-parallel conversion circuit 110, exemplarily, in the example shown in FIG. 3A, for example, M=4, then m∈{1,2,3,4}. The sampling signal generator 111 may be a sequential pulse generator and includes 4 output terminals ($A_0$~$A_3$). These 4 first latches 112 are coupled in parallel with each other. In addition to the first input terminal D1, the second input terminal C1 and the output terminal Q1, each first latch 112 also includes a reset terminal RST. All reset terminals RST of the 4 first latches 112 are configured to receive a reset signal $S_{RST}$. The $m^{th}$ first latch 112 uses the $m^{th}$ sampling pulse signal $S_{m-1}$ as a clock signal to latch and output the serial data $S_{IN}$.

Figure 3B:
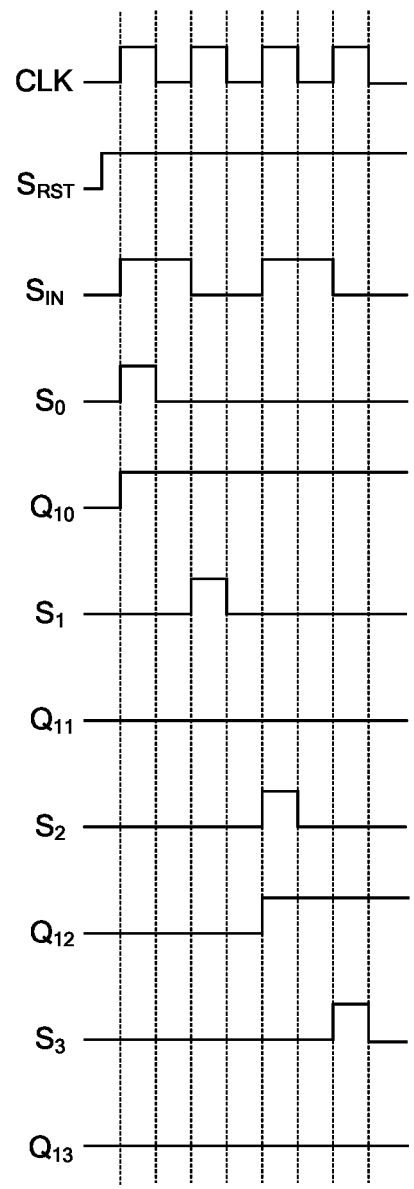
FIG. 3B schematically shows a timing diagram of the serial-to-parallel conversion circuit shown in FIG. 3A according to an embodiment of the present disclosure.

FIG. 3B schematically shows a timing diagram of the serial-to-parallel conversion circuit 110 shown in FIG. 3A according to an embodiment of the present disclosure.

As shown in FIG. 3B, the sampling signal generator 111 respectively outputs 4 sampling pulse signals ($S_0$~$S_3$) whose effective pulse edges differ from each other by a first set time in sequence based on the initial clock signal CLK. For example, the signal timing of 4 sampling pulse signals ($S_0$~$S_3$) is shown in FIG. 3B, and the first set time is 1 initial clock cycle. The signal timing of the serial data $S_{IN}$ is shown in FIG. 3B. For example, an effective data length of the serial data $S_{IN}$ is 4 bits, and includes a 4-bit sequence "1", "0", "1" and "0" in an order of transmission time. An output $Q_{10}$ of the first latch 112, under an action of the serial data $S_{IN}$ and a first sampling pulse signal $S_0$, changes to a high level and remains at the high level after a rising edge of the first sampling pulse signal $S_0$ arrives, so that the serial-to-parallel conversion of the $1^{st}$ bit of data "1" transmitted in the serial data $S_{IN}$ is realized. An output $Q_{11}$ of the second first latch 112, under an action of the serial data $S_{IN}$ and a second sampling pulse signal $S_1$, remains at a low level after a rising edge of the second sampling pulse signal $S_1$ arrives, so that the serial-to-parallel conversion of the $2^{nd}$ bit of data "0" transmitted in the serial data $S_{IN}$ is realized. An output $Q_{12}$ of the third first latch 112, under an action of the serial data $S_{IN}$ and a third sampling pulse signal $S_2$, changes to a high level and remains at the high level after a rising edge of the third sampling pulse signal $S_2$ arrives, so that the serial-to-parallel conversion of the $3^{rd}$ bit of data "1" transmitted in the serial data $S_{IN}$ is realized. An output $Q_{13}$ of the fourth first latch 112, under an action of the serial data $S_{IN}$ and a fourth sampling pulse signal $S_3$, remains at a low level after a rising edge of the fourth sampling pulse signal $S_3$ arrives, so that the serial-to-parallel conversion of the $4^{th}$ bit of data "0" transmitted in the serial data $S_{IN}$ is realized. Effective parts "1", "0", "1" and "0" in the outputs ($Q_{10}$~$Q_{13}$) of the four first latches 112 constitute a group of parallel data with a data width of 4 bits.

It can be seen from FIGS. 3A and 3B that the effective pulse duration of each bit of data in the serial data $S_{IN}$ after the serial-to-parallel conversion is much longer than 1 initial clock cycle, and the data in the serial-to-parallel conversion circuit 110 does not shift. Therefore, the data that completes the serial-to-parallel conversion earlier may be separated from the data that completes the serial-to-parallel conversion later for subsequent output processing. Large time redundancy is left for subsequent output, and data transmission is not prone to errors even when an initial clock frequency is large.

Hereinafter, the working principles of the intermediate-stage cache circuit, the latch output circuit, and the selection control circuit according to an embodiment of the present disclosure are exemplarily described with reference to FIGS. 4 and 5.

Figure 4:
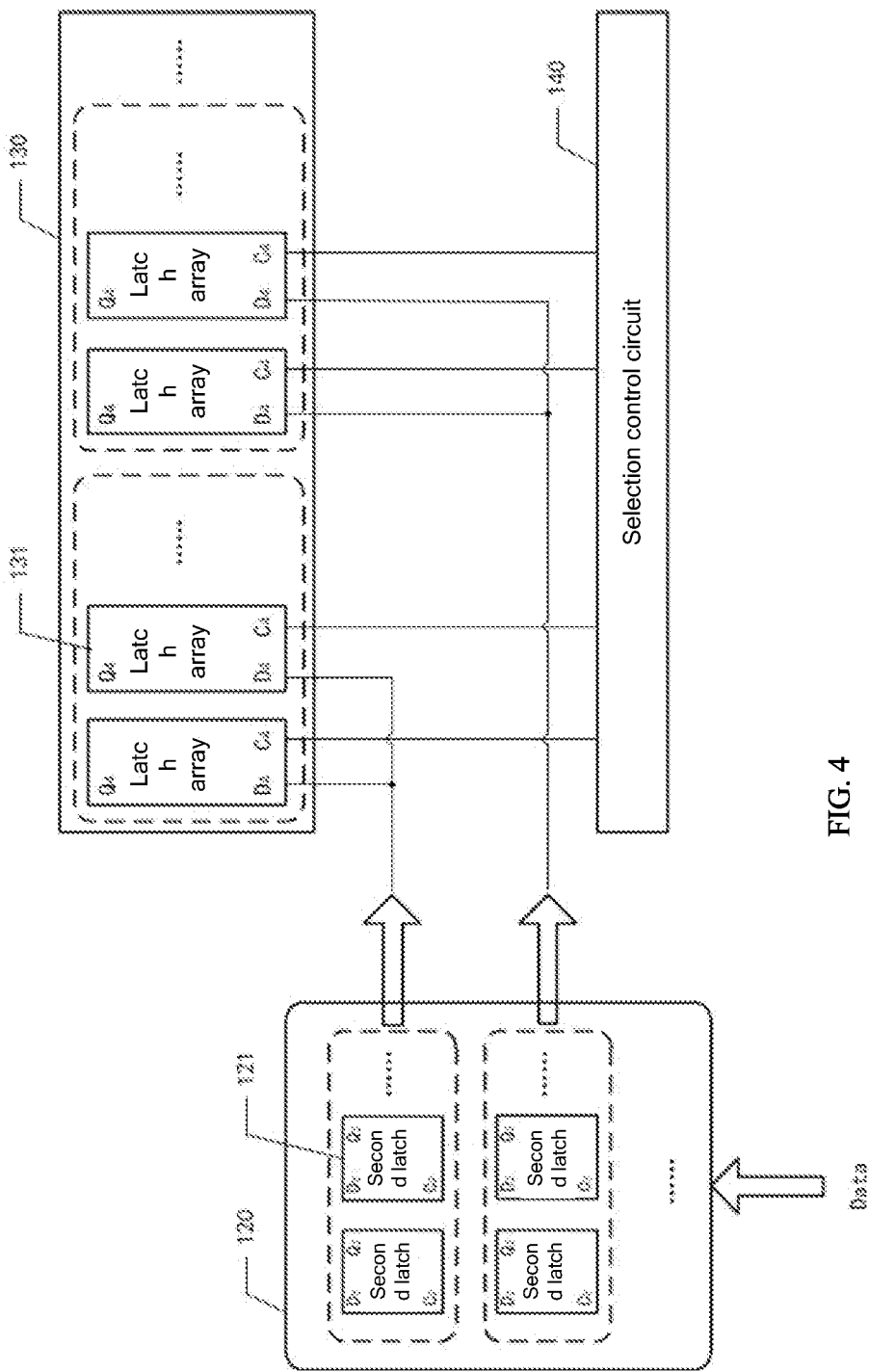
FIG. 4 schematically shows an example block diagram of an intermediate-stage cache circuit, a latch output circuit, and a selection control circuit shown in FIG. 1 according to an embodiment of the present disclosure.

FIG. 4 schematically shows example block diagrams of the intermediate-stage cache circuit 120, the latch output circuit 130, and the selection control circuit 140 shown in FIG. 1 according to an embodiment of the present disclosure.

As shown in FIG. 4, accompanying with the serial-to-parallel conversion circuit 110 including M first latches 112 coupled in parallel, the intermediate-stage cache circuit 120 may include M second latches 121. The M second latches 121 may be divided into P second latch groups (each dashed box in the intermediate-stage cache circuit 120 indicates a second latch group), indicating that any parallel data Data is divided into P categories of subgroup parallel data. A $p^{th}$ second latch group in the P second latch groups includes a $\{[(p-1)\times M/1]+1\}^{th}$ second latch 121 to a $(p\times M/P)^{th}$ second latch 121 in the M second latches 121 described above. The $p^{th}$ second latch group is configured to output the $p^{th}$ category of subgroup parallel data of a group of parallel data for any M-bit sequence in the serial data $S_{IN}$. Herein, P is an integer greater than 1, p is an integer greater than or equal to 1 and less than or equal to P, and M may be divisible by P.

Each of the M second latches 121 described above includes a first input terminal $D_2$, a second input terminal $C_2$, and an output terminal $Q_2$. A first input terminal $D_2$ of an $m^{th}$ second latch 121 in the M second latches 121 is electrically coupled to the output terminal $Q_1$ of the $m^{th}$ first latch 112 described above. Exemplarily, the $p^{th}$ second latch group, after first input terminals $D_2$ of all the second latches 121 in the $p^{th}$ second latch group received data that completes the serial-to-parallel conversion, performs latch and output. The second latch 121 may perform timing control of the latching and outputting through an input of the second input terminal $C_2$. For example, m=p×M/P, a time when the $m^{th}$ second latch 121 in the $p^{th}$ second latch group receives data is the latest, then all second input terminals $C_2$ of the M/P second latches 121 in the $p^{th}$ second latch group may be electrically coupled to the $m^{th}$ output terminal S of the sampling signal generator 111 shown in FIG. 3A.

For example, according to actual requirements, M=12 and P=2 are set, which indicates that the output control circuit 100 needs to perform the serial-to-parallel conversion on each 12-bit sequence in the serial data $S_{IN}$ to obtain a group of parallel data with a data width of 12 bits. And for each group of parallel data, the data that completes the serial-to-parallel conversion earlier is firstly input into the intermediate-stage cache circuit 120 for caching. Exemplarily, a $1^{st}$ second latch 121 to a $6^{th}$ second latch 121 in the intermediate-stage cache circuit 120 are divided into a $1^{st}$ second latch group, which receives the $1^{st}$ bit of the data to the $6^{th}$ bit of the data that completes the serial-to-parallel conversion earlier, respectively, and latches and outputs the $1^{st}$ bit of the data to the $6^{th}$ bit of the data, to obtain a first category of subgroup parallel data. A $7^{th}$ second latch 121 to a $12^{th}$ second latch 121 in the intermediate-stage cache circuit 120 are divided into a $2^{nd}$ second latch group, which receives the $7^{th}$ bit of the data to the $12^{th}$ bit of the data that completes the serial-to-parallel conversion later, respectively, and latches and outputs the $7^{th}$ bit of the data to the $12^{th}$ bit of the data, to obtain a second category of subgroup parallel data.

Continuing to refer to FIG. 4, according to an embodiment of the present disclosure, accompanying with the intermediate-stage cache circuit 120 mentioned above, the latch output circuit 130 may include P×N latch arrays 131. The P×N latch arrays 131 may be divided into P latch array groups (each dashed box in the latch output circuit 130 indicates a second latch array group), and each latch array group includes N latch arrays 131. The P latch array groups have a one-to-one correspondence with the P second latch groups in the intermediate-stage cache circuit 120, that is, have a one-to-one correspondence with the P categories of subgroup parallel data. Each of the P×N latch arrays 131 described above includes a first input terminal $D_4$, a second input terminal $C_4$, and an output terminal $Q_4$. An output terminal $Q_2$ of each second latch 121 in the $p^{th}$ second latch group is electrically coupled to a first input terminal of each latch array 131 in a $p^{th}$ latch array group. Herein, N is a positive integer. When the serial data $S_{IN}$ includes X-bit data, N=X/M, wherein X is an integer greater than 1, and the serial-to-parallel conversion circuit 110 performs the serial-to-parallel conversion on the serial data $S_{IN}$ to obtain N groups of parallel data, a data width of each group of parallel data is M bits.

Figure 5:
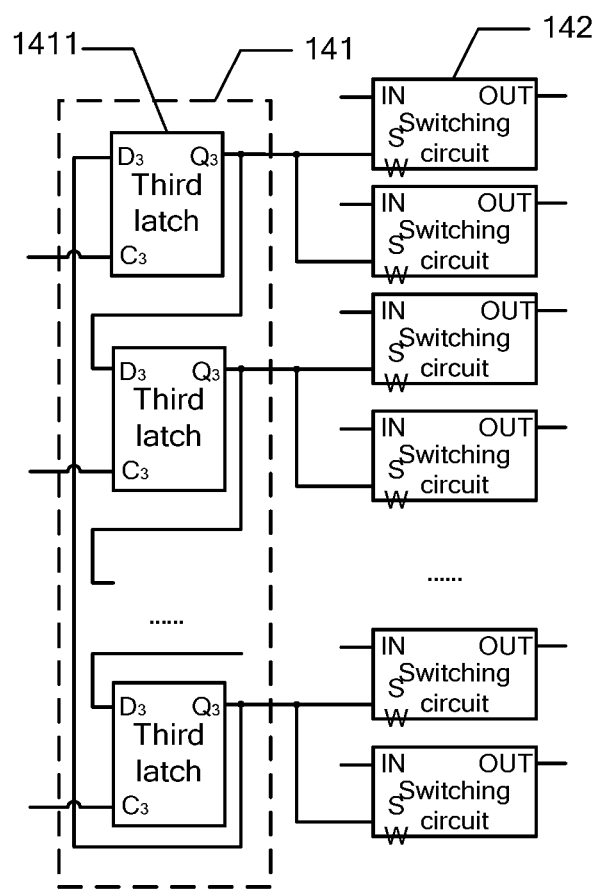
FIG. 5 schematically shows an example block diagram of an selection control circuit shown in FIG. 4 according to an embodiment of the present disclosure.

FIG. 5 schematically shows an example block diagram of the selection control circuit 140 shown in FIG. 4 according to an embodiment of the present disclosure.

As shown in FIG. 5, accompanying with the latch output circuit 130 described above, the selection control circuit 140 may include a ring counter 141 and P×N switching circuits 142. The P×N switching circuits 142 have a one-to-one correspondence with the P×N latch arrays 131 described above.

The ring counter 141 is configured to, within the effective pulse duration of the any subgroup parallel data, control a switching circuit 142 for the any subgroup parallel data in the P×N switching circuits 142 to output a control signal, so as to control a latch array 131 for the any subgroup parallel data in the P×N latch arrays 131 to latch and output the any subgroup parallel data by using the control signal.

According to an embodiment of the present disclosure, a $p^{th}$ category of the switching circuit 142 in the P×N switching circuits 142 includes N switching circuits 142. Each of the P×N switching circuits 142 includes a first input terminal IN, a second input terminal SW, and an output terminal OUT. The ring counter 141 includes N stages of third latches 1411 coupled in cascade. Each of the N stages of third latches 1411 includes a first input terminal $D_3$, a second input terminal $C_3$, and an output terminal $Q_3$.

An $n^{th}$ stage of third latch 1411 in the N stages of third latches 1411 is configured to control the P switching circuits 142. An output terminal $Q_3$ of the $n^{th}$ stage of third latch 1411 is electrically coupled to a first input terminal $D_3$ of an $(n+1)^{th}$ stage of third latch 1411. An effective pulse edge of a clock signal received by a second input terminal $C_3$ of the $n^{th}$ stage of third latch 1411 differs from an effective pulse edge of a clock signal received by a second input terminal $C_3$ of an $(n-1)^{th}$ stage of third latch 1411 by a second set time. An output terminal $Q_3$ of the $n^{th}$ stage of third latch 1411 is electrically coupled to a first input terminal $D_3$ of the $(n+1)^{th}$ stage of third latch 1411, and second input terminals SW of the P switching circuits 142 controlled by the $n^{th}$ stage of third latch 1411. An output terminal OUT of the $p^{th}$ switching circuit 142 in the P switching circuits 142 controlled by the $n^{th}$ stage of third latch 1411 is electrically coupled to second input terminals $C_4$ of the $n^{th}$ latch array 131 in the N latch arrays 131 in the $p^{th}$ latch array group described above. First input terminals of the P×N switching circuits 142 are configured to receive clock signals, and effective pulse edges of the clock signals received by first input terminals IN of any two adjacent switching circuits 142 in the P×N switching circuits 142 differ from each other by a third set time. Herein, in a case where the $N^{th}$ stage of third latch in the N stages of third latches 1411 is coupled to a $1^{st}$ stage of third latch in the N stages of third latches 1411, n is an integer greater than or equal to 1 and less than or equal to N. When n is equal to N, the $1^{st}$ stage of third latch 1411 acts as the $(n+1)^{th}$ stage of third latch 1411. When n is equal to 1, the $N^{th}$ stage of third latch 1411 acts as the $(n-1)^{th}$ stage of third latch 1411.

For example, in a scene where a display device transmits 176×176 display data, since data amount of one row is 176 RGB signals, the data amount of one row is 176×3=528 bits of data. The output control circuit is exemplarily described below by taking a transmission of 528-bit data as an example. In this example, a data length of the input serial data $S_{IN}$ is 528 bits, and the M of the output control circuit is set to 12, that is, a data width of each group of parallel data obtained after the serial-to-parallel conversion is 12 bits, then the output control circuit needs to output 528/12=44 groups of parallel data.

Figure 6A:
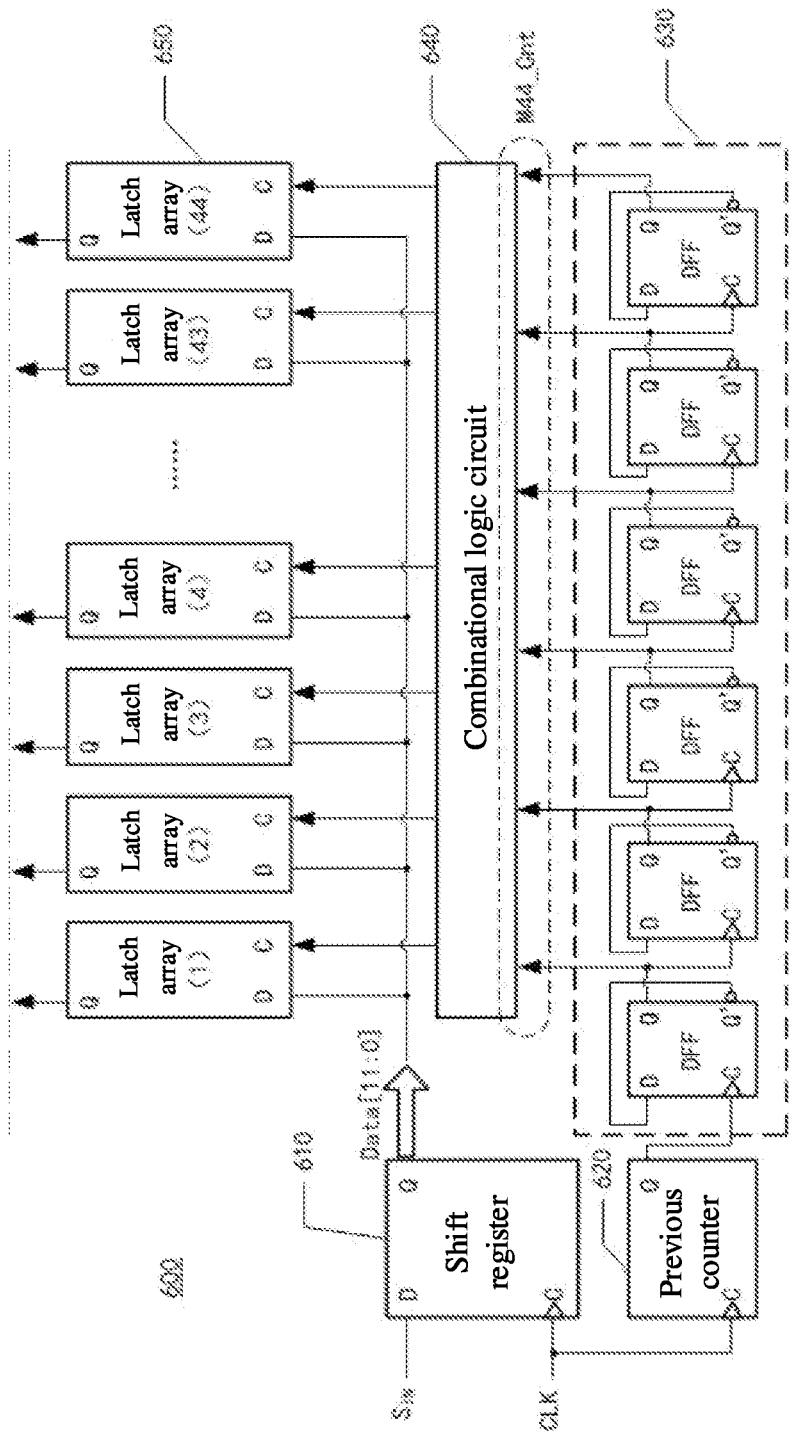
FIG. 6A schematically shows an example block diagram of an output control circuit in a design manner.
Figure 6B:
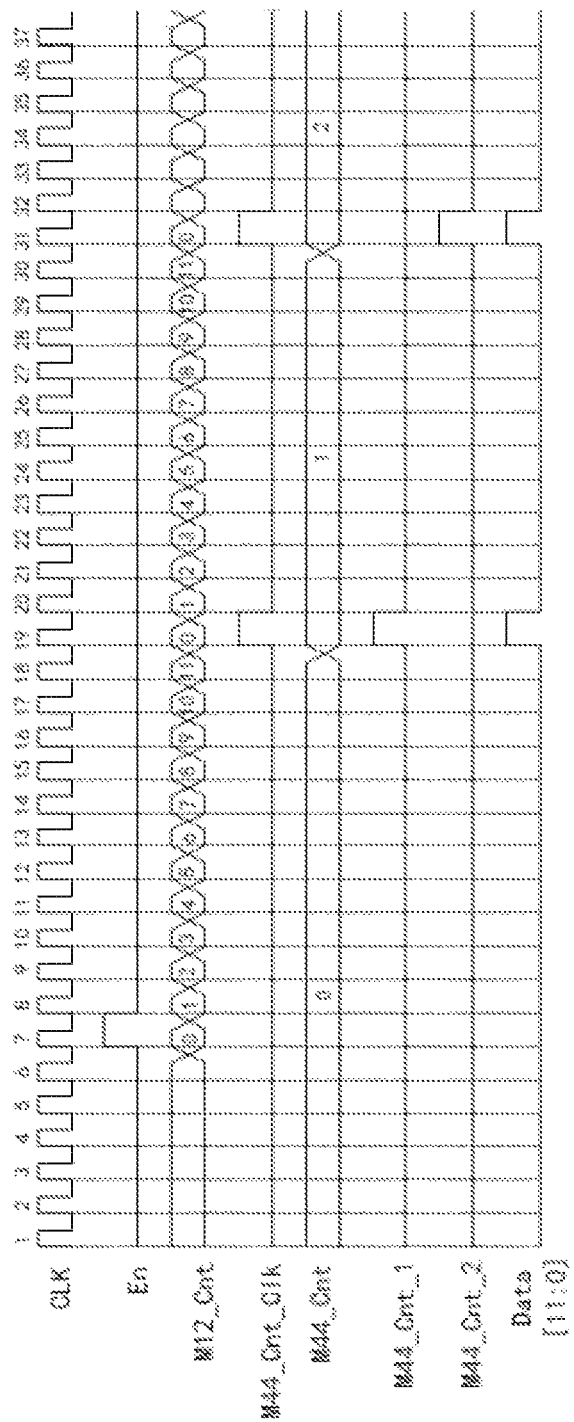
FIG. 6B schematically shows a timing diagram of the output control circuit shown in FIG. 6A.

FIG. 6A schematically shows an example block diagram of an output control circuit in a design manner. FIG. 6B schematically shows a timing diagram of the output control circuit shown in FIG. 6A.

As shown in FIGS. 6A and 6B, an output control circuit 600 in a design may include: a 12-bit shift register 610, a previous counter 620, a 44-bit counter 630, a combinational logic circuit 640, and 44 latch arrays 650 (latch array (1)~latch array (44)). The working principle of the serial-to-parallel conversion of the serial data $S_{IN}$ by the shift register has been described in detail in above descriptions of FIGS. 2A and 2B, and will not be repeated here.

The 12-bit shift register 610 and the previous counter 620 use the same initial clock signal CLK. The previous counter 620 counts based on an enable signal En and the initial clock signal CLK, and outputs a counting output M44_Cnt_Clk every time a counting result M12_Cnt accumulates to 12, and the counting output M44_Cnt_Clk acts as a clock signal of the 44-bit counter 630. The 44-bit counter 630 counts based on the clock signal M44_Cnt_Clk, and generates a control signal (one of control signals M44_Cnt_1 to M44_Cnt_44) through the combinational logic circuit 640 every time a counting result M44_Cnt changes. A control signal may control one of the 44 latch arrays 650 to latch and output parallel data Data [11:0] output by the shift register 610. According to above logic, 44 latch arrays 650 are sequentially controlled to latch 44 groups of parallel data obtained by serial-to-parallel conversion of the shift register 610 to an output terminal. According to the working principle of the shift register shown in FIGS. 2A and 2B, values in the shift register change every clock cycle, that is, effective pulse duration of parallel data is 1 clock cycle. Therefore, the control signal (one of the control signals M44_Cnt_1~M44_Cnt_44) is required to cause a latch array to latch and output a correct 12-bit data within a correct clock cycle. However, because the wiring itself in the circuit will delay a signal, it is difficult to ensure that each latch array may latch correct data within the 1 clock cycle redundancy.

Figure 7A:
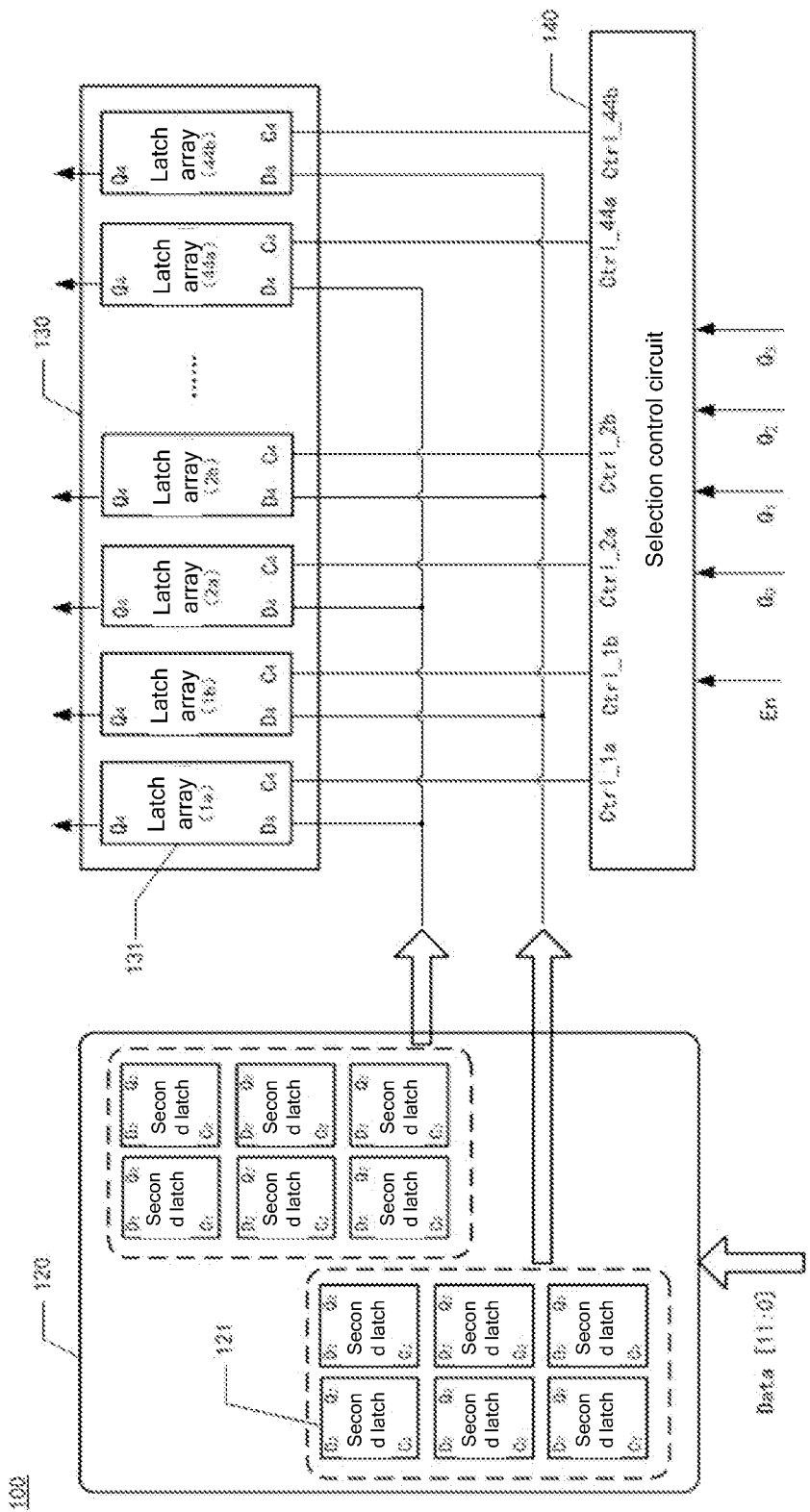
FIG. 7A schematically shows an example block diagram of an output control circuit shown in FIG. 1 according to an embodiment of the present disclosure.
Figure 7B:
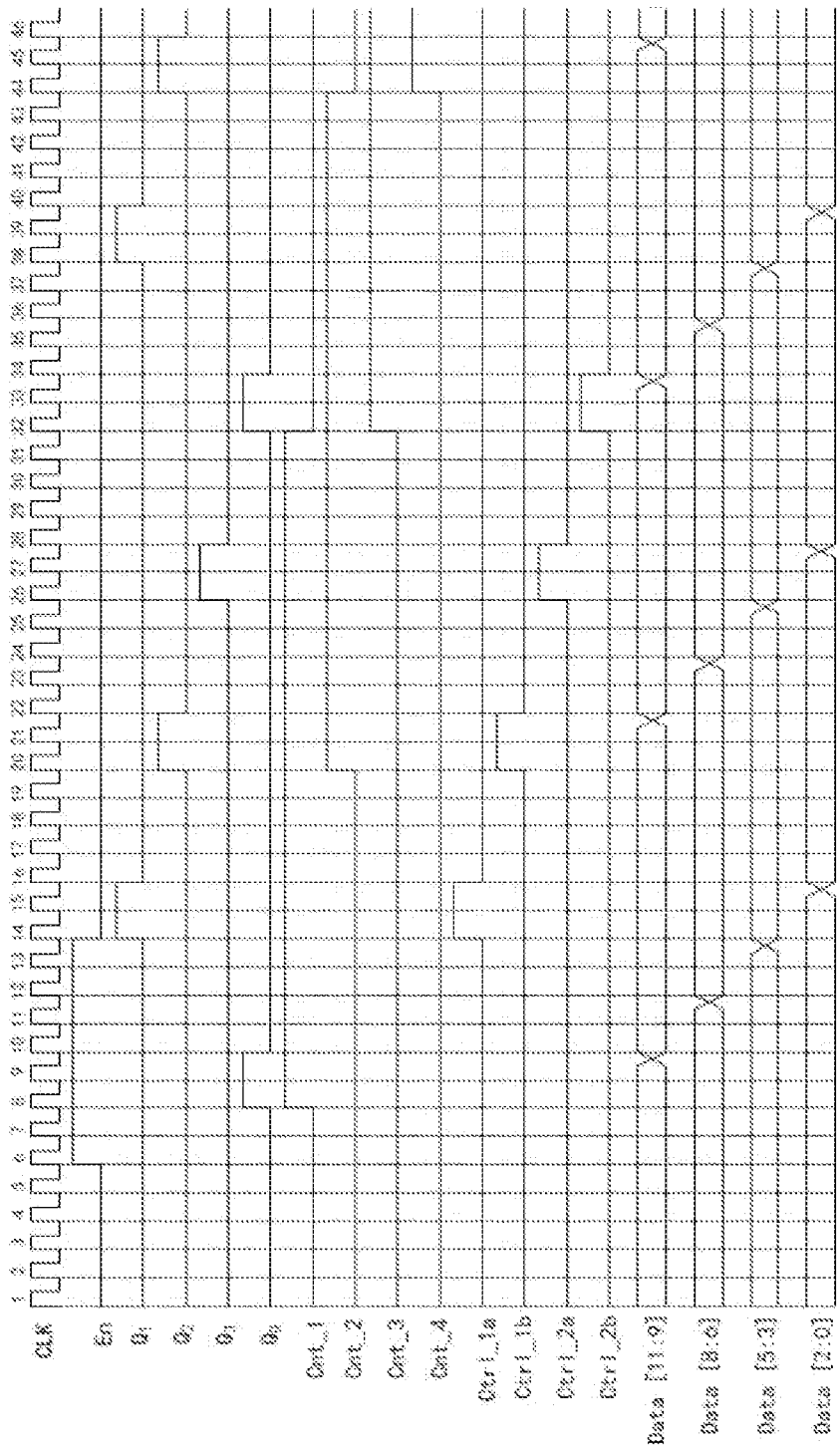
FIG. 7B schematically shows a timing diagram of the output control circuit shown in FIG. 7A.
Figure 7C:
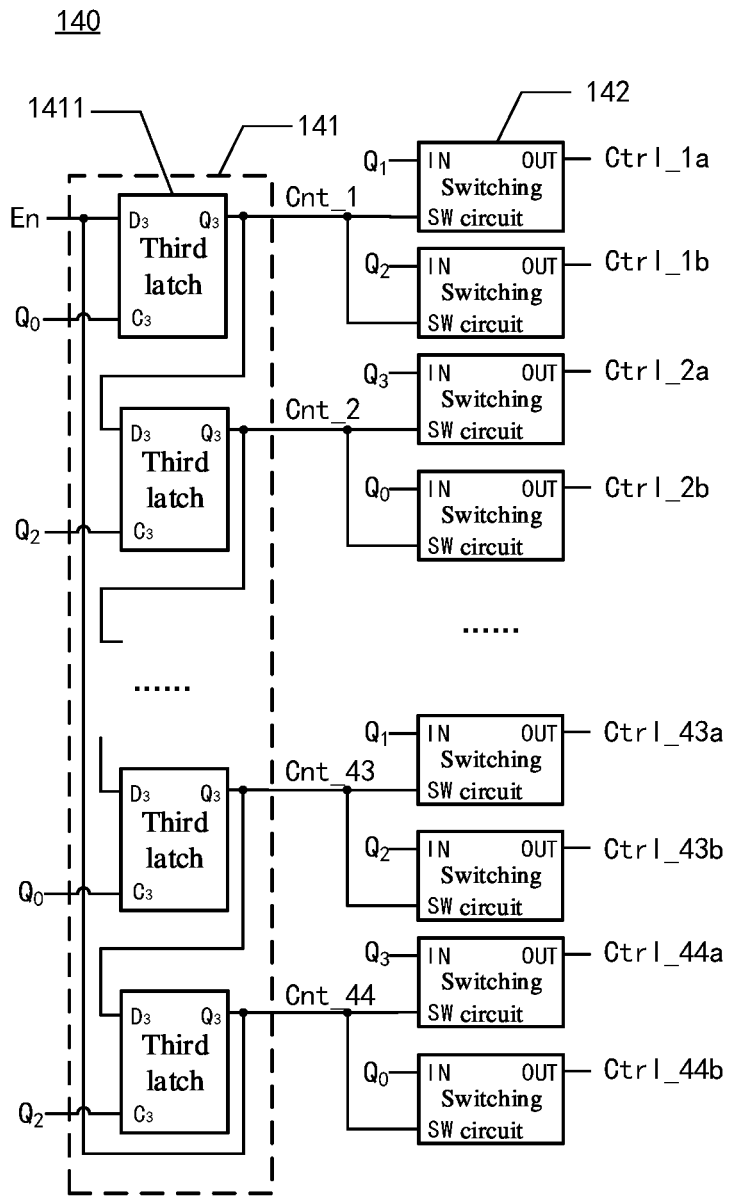
FIG. 7C schematically shows an example block diagram of an selection control circuit shown in FIG. 7A.

FIG. 7A schematically shows an example block diagram of the output control circuit shown in FIG. 1 according to an embodiment of the present disclosure. FIG. 7B schematically shows a timing diagram of the output control circuit shown in FIG. 7A. FIG. 7C schematically shows an example block diagram of the selection control circuit shown in FIG. 7A.

As shown in FIGS. 7A and 7B, the output control circuit 100 may include: an intermediate-stage cache circuit 120, a latch output circuit 130, and a selection control circuit 140. Compared with the designs shown in FIGS. 6A and 6B, the output control circuit 100 according to an embodiment of the present disclosure uses a serial-to-parallel conversion circuit 110 (not shown in FIG. 7A) to convert serial data $S_{IN}$ into 44 groups of parallel data Data [11:0]. The working principle of the serial-to-parallel conversion circuit 110 performing the serial-to-parallel conversion on the serial data $S_{IN}$ has been described in detail in above descriptions of FIGS. 3A and 3B. In this example, M needs to be set to 12 only, and related descriptions will not be repeated here.

The intermediate-stage cache circuit 120 caches the parallel data Data [11:0] obtained through the serial-to-parallel conversion. For example, according to sequence of the serial-to-parallel conversion in the serial-to-parallel conversion circuit 110, each group of parallel data Data [11:0] is divided into "a" category of subgroup parallel data Data_a and "b" category of subgroup parallel data Data_b. Correspondingly, 12 second latches 121 in the intermediate-stage cache circuit 120 may be divided into a $1^{st}$ second latch group and a $2^{nd}$ second latch group. Each of 6 second latches 121 in the $1^{st}$ second latch group latches and outputs Data [11:6] in a group of parallel data Data [11:0] to obtain the subgroup parallel data Data_a. Each of 6 second latches 121 in the $2^{nd}$ second latch group latches and outputs Data [5:0] in a group of parallel data Data [11:0] to obtain the subgroup parallel data Data_b. Each of the second latches 121 latches and outputs the data received by the first input terminal $D_2$ of each of the second latches 121 based on the clock signal received by the second input terminal $C_2$ of each of the second latches 121. Finally, 88 subgroups of parallel data (Data_a_1~Data_a_44, Data_b_1~Data_b_44) may be obtained by dividing 44 groups of parallel data Data [11:0].

The latch output circuit 130 includes 88 latch arrays 131 (latch array (1a)~latch array (44a), latch array (1b)~latch array (44b)). Each latch array 131 includes 6 latches. Among which, each of subgroups of parallel data (Data_a_1~Data_a_44) of "a" category is input to the first input terminal $D_4$ of the latch array 131 (latch array (1a) ~latch array (44a)), respectively. Each of subgroups of parallel data (Data_b_1~Data_b_44) of "b" category is input to the first input terminal $D_4$ of the latch array 131 (latch array (1b)~latch array (44b)), respectively. Each latch array 131 latches and outputs the subgroup parallel data received by the first input terminal $D_4$ based on the control signal received by the second input terminal $C_4$.

The selection control circuit 140 generates a control signal for the any subgroup parallel data and transmits the control signal to the latch output circuit 130 within effective pulse duration of the any subgroup parallel data, thereby controlling a latch array 131 for the subgroup parallel data to output the subgroup parallel data.

As shown in FIGS. 7B and 7C, exemplarily, the selection control circuit 140 may include a ring counter 141 and 88 switching circuits 142. Compared with the designs shown in FIGS. 6A and 6B, the embodiment of the present disclosure changes 44-bit traveling wave counting of the 44-bit counter 630 to 44-bit ring counting. The ring counter 141 includes 44 stages of third latches 1411 that are cascaded and coupled end to end. The output Cnt_n at the output terminal $Q_3$ of the $n^{th}$ stage of third latch 1411 acts as an input to the first input terminal $D_3$ of the $(n+1)^{th}$ stage of third latch 1411. Herein, n is an integer greater than or equal to 1 and less than or equal to 44. In a case where n=44, the $1^{st}$ stage of third latch 1411 acts as the $(n+1)^{th}$ stage of third latch 1411, and in a case where n=1, the $44^{th}$ stage of third latch 1411 acts as the $(n-1)^{th}$ stage of third latch 1411. An enable signal En triggers the ring counter 141 to start working. The ring counter 141 uses alternating third latch 1411 for counting. For example, auxiliary clock signals $Q_0$ and $Q_2$ are alternately input to the second input terminal $C_3$ of each third latch 1411, and each third latch 1411 performs sampling output based on the auxiliary clock signals to realize ring counting, and obtains a counting pulse (one of Cnt_1~Cnt_44) after each counting. The output terminal $Q_3$ of the $n^{th}$ stage of third latch 1411 in the 44 stages of third latches 1411 is electrically coupled to second input terminals SW of two switching circuits 142. Therefore, 2 switching circuits 142 for the same counting pulse may be temporarily turned on during the counting pulse being at a high level, that is, 2 switching circuits are controlled to transmit two of the auxiliary control signals $Q_0$ to $Q_3$ input to the first input terminals IN of these 2 switching circuits, thereby generating 2 control signals. By adjusting timing relationship between the auxiliary control signals $Q_0$ to $Q_3$, effective pulse duration of these 2 control signals may be adjusted to be the same or to be different.

For example, the ring counter 141 obtains a counting pulse Cnt_1 for the first counting, and temporarily turns on switches of the two switching circuits receiving the counting pulse Cnt_1 under control of the counting pulse Cnt_1, and outputs the auxiliary control signals $Q_1$ and $Q_2$ to obtain two control signals Ctrl_1a and Ctrl_1b. Herein, the control signal Ctrl_1a triggers the latch array (1a) to latch and output, and the control signal Ctrl_1b triggers the latch array (1b) to latch and output. In this solution, as shown in FIG. 7B, effective pulses of the auxiliary control signals $Q_0$ to $Q_3$ do not overlap each other, and only one latch array 131 latches and outputs at a time.

Continuing to refer to FIG. 7B, the output control circuit 100 implements corresponding logic functions under control of the initial clock signal CLK. FIG. 7B only shows a timing diagram of the counting pulses Cnt_1 to Cnt_4, the control signals Ctrl_1a, Ctrl_1b, Ctrl_2a, and Ctrl_2b for exemplary explanation. By setting a clock signal input at the second input terminal C2 of each second latch 121 in the intermediate-stage cache circuit 120, Data [11:9], in each of "a" category of subgroup parallel data, is output synchronously, and Data [8:6], in each of "a" category of subgroup parallel data, is output synchronously. Further, in each of "b" category of subgroup parallel data, Data [5:3] is output synchronously, and Data [2:0] is output synchronously. Herein, an effective pulse of a control signal for "a" category of subgroup parallel data may be set within effective pulse duration common to Data [11:9] and Data [8:6], and the effective pulse duration occupies around 9 initial clock cycles. An effective pulse of a control signal for "b" category of subgroup parallel data may be set within effective pulse duration common to Data [5:3] and Data [2:0], and the effective pulse duration occupies around 9 initial clock cycles. Therefore, sufficient time redundancy is reserved for the latch output circuit 130 to latch and output each of subgroups of parallel data, and latching and output of different categories of subgroup parallel data do not conflict with each other.

According to an embodiment of the present disclosure, at least one of the first latch, the second latch, and the third latch may be a D-type latch (D Latch).

The output control circuit designed according to an embodiment of the present disclosure may reserve larger timing redundancy for data transmission and output, which may promote an increase of the maximum operating frequency of the circuit, and is suitable for longer data transmission wiring, that is, in circuits where a delay caused by wiring is large.

According to a technical solution of an embodiment of the present disclosure, the serial-to-parallel conversion circuit asynchronously completes the serial-to-parallel conversion of each bit of data in the serial data. The intermediate-stage cache circuit, in cooperation with the serial-to-parallel conversion circuit, caches different categories of subgroup parallel data belonging to the same group of parallel data according to the serial-to-parallel conversion sequence in the serial-to-parallel conversion circuit. The latch output circuit latches and outputs different categories of subgroup parallel data through different latch arrays under control of the selection control circuit. This circuit design method may reduce an impact among different categories of subgroup parallel data in the serial-to-parallel conversion process and an impact in the latch and output processes, so that effective pulse duration of a subgroup parallel data may theoretically be continued from a time when the subgroup parallel data completes the serial-to-parallel conversion to a time when the same category of the next subgroup parallel data completes the serial-to-parallel conversion, and thus the effective pulse duration of each subgroup parallel data is much longer than 1 initial clock cycle. Therefore, the output control circuit according to the embodiments of the present disclosure significantly increases the time redundancy of the output control circuit, thereby improving the accuracy of the process for transmitting data.

According to an embodiment of the present disclosure, a method for transmitting data is also provided, which will be described below from a perspective of a sending terminal. It should be noted that sequence number of each step in the following method is only used to indicate the step for description, and should not be regarded as indicating an execution order of various steps. Unless explicitly indicated, the method does not need to be executed exactly in the order shown.

Figure 8A:
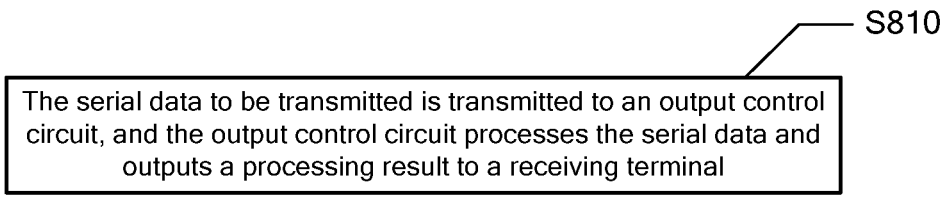
FIGS. 8A and 8B schematically show flowcharts of a method for transmitting data according to an embodiment of the present disclosure.
Figure 8B:
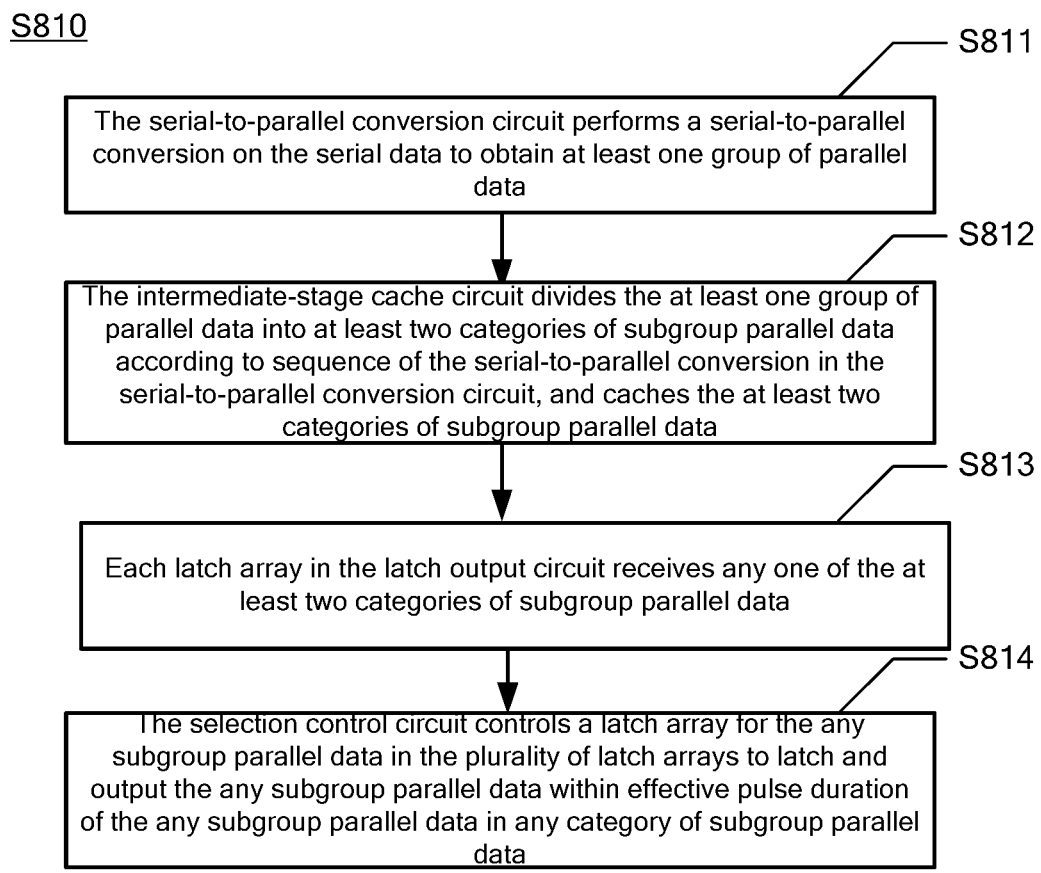

FIGS. 8A and 8B schematically show a flowchart of a method for transmitting data according to an embodiment of the present disclosure.

As shown in FIG. 8A, the method may include the following step S810.

In step S810, serial data to be transmitted is transmitted to an output control circuit, and the output control circuit processes the serial data and outputs a processing result to a receiving terminal.

Herein, the output control circuit used in this step S810 may be the output control circuit 100 according to an embodiment of the present disclosure. The working principle of the output control circuit 100 has been described in detail above, and the related descriptions will not be repeated. The output control circuit used in this step S810 may include a serial-to-parallel conversion circuit, an intermediate-stage buffer circuit, a latch output circuit, and a selection control circuit.

Further, as shown in FIG. 8B, the step S810 includes the following sub-steps:

In sub-step S811, the serial-to-parallel conversion circuit performs a serial-to-parallel conversion on the serial data to obtain at least one group of parallel data.

In sub-step S812, the intermediate-stage cache circuit receives the at least one group of parallel data, and divides the at least one group of parallel data into at least two categories of subgroup parallel data according to sequence of the serial-to-parallel conversion in the serial-to-parallel conversion circuit, and caches the at least two categories of subgroup parallel data.

In sub-step S813, each latch array in the latch output circuit receives any one of the at least two categories of subgroup parallel data.

In sub-step S814, the selection control circuit controls a latch array for the any subgroup parallel data in the plurality of latch arrays to latch and output the any subgroup parallel data within effective pulse duration of the any subgroup parallel data in any category of subgroup parallel data.

The present disclosure also provides an electronic device, which may be various electronic devices such as smart TVs, smart phones, personal computers, tablet computers, smart watches, smart glasses, etc., which are not displayed here. The electronic device includes the output control circuit described above, which may be used to execute the method for transmitting data described above.

It should be noted that in the above description, the technical solutions of the embodiments of the present disclosure are shown by way of example only, but it does not mean that the embodiments of the present disclosure are limited to the above steps and structures. Where possible, the steps and structure may be adjusted and selected as needed. Therefore, some steps and units are not essential elements for implementing the overall inventive idea of the embodiments of the present disclosure.

So far, the present disclosure has been described in conjunction with the preferred embodiments. It should be understood that those skilled in the art may make various other changes, substitutions and additions without departing from the spirit and scope of the embodiments of the present disclosure. Therefore, the scope of the embodiments of the present disclosure is not limited to the above specific embodiments, but should be defined by the appended claims.

What is claimed is:

1. An output control circuit, comprising:
a serial-to-parallel conversion circuit, an intermediate-stage cache circuit, a latch output circuit, and a selection control circuit coupled in sequence; wherein:
the serial-to-parallel conversion circuit is configured to perform a serial-to-parallel conversion on input serial data to obtain at least one group of parallel data;
the intermediate-stage cache circuit is configured to receive the at least one group of parallel data, and divide the at least one group of parallel data into at least two categories of subgroup parallel data according to a sequence of serial-to-parallel conversion in the serial-to-parallel conversion circuit, and cache the at least two categories of subgroup parallel data;
the latch output circuit comprises a plurality of latch arrays, and each of the plurality of latch arrays is configured to receive any one of the at least two categories of subgroup parallel data, and latch and output any subgroup parallel data in any category of subgroup parallel data; and
the selection control circuit is configured to, within an effective pulse duration of the any subgroup parallel data, control a latch array for the any subgroup parallel data in the plurality of latch arrays to latch and output the any subgroup parallel data.

2. The output control circuit according to claim 1, wherein the serial-to-parallel conversion circuit comprises:
a sampling signal generator comprising M output terminals configured to output M sampling pulse signals whose effective pulse edges differ from each other by a first set time in sequence; and
M first latches coupled in parallel each of which comprising a first input terminal, a second input terminal, and an output terminal;
wherein first input terminals of the M first latches are configured to receive the serial data, and a second input terminal of an $m^{th}$ first latch in the M first latches is electrically coupled to an $m^{th}$ output terminal in the M output terminals of the sampling signal generator;
wherein the $m^{th}$ first latch is configured to latch and output an $m^{th}$ bit of data in any M-bit sequence in the serial data based on an $m^{th}$ sampling pulse signal output from the $m^{th}$ output terminal, and an output terminal of the $m^{th}$ first latch outputs the $m^{th}$ bit of data in a group of parallel data for any M-bit sequence; and
wherein M is an integer greater than 1, and m is an integer greater than or equal to 1 and less than or equal to M.

3. The output control circuit according to claim 2, wherein the intermediate-stage cache circuit comprises:
M second latches, wherein the M second latches are divided into P second latch groups, and a $p^{th}$ second latch group in the P second latch groups comprises a $\{[(p-1) \times M/P]+1\}^{th}$ second latch to a $(p \times M/P)^{th}$ second latch in the M second latches;
wherein each of the M second latches comprises a first input terminal, a second input terminal, and an output terminal, and a first input terminal of an $m^{th}$ second latch in the M second latches is electrically coupled to an output terminal of the $m^{th}$ first latch; second input terminals of the M second latches are configured to receive a clock signal; output terminals of M/P second latches in the $p^{th}$ second latch group are configured to output a $p^{th}$ category of subgroup parallel data in the at least two categories of subgroup parallel data; and
wherein P is an integer greater than 1, p is an integer greater than or equal to 1 and less than or equal to P, and M is divisible by P.

4. The output control circuit according to claim 3, wherein:
the plurality of latch arrays comprises P×N latch arrays, the P×N latch arrays are divided into P latch array groups, a $p^{th}$ latch array group in the P latch array groups comprises N latch arrays, and each of the P×N latch arrays comprises a first input terminal, a second input terminal, and an output terminal;
wherein output terminals of the M/P second latches in the $p^{th}$ second latch group are electrically coupled to a first input terminal of the N latch arrays in the $p^{th}$ latch array group; and
wherein N is a positive integer, and when the serial data comprises X-bit data, N=X/M, wherein X is an integer greater than 1.

5. The output control circuit according to claim 3, wherein when m=p×M/P, second input terminals of the M/P second latches in the $p^{th}$ second latch group are electrically coupled to the $m^{th}$ output terminal of the sampling signal generator.

6. The output control circuit according to claim 4, wherein the selection control circuit comprises:
- a plurality of switching circuits; and
- a ring counter configured to, within the effective pulse duration of the any subgroup parallel data, control a switching circuit for the any subgroup parallel data in the plurality of switching circuits to output a control signal, and control a latch array for the any subgroup parallel data in the plurality of latch arrays to latch and output the any subgroup parallel data by using the control signal.

7. The output control circuit according to claim 6, wherein:
- the plurality of switching circuits comprise P×N switching circuits, each of the P×N switching circuits comprising a first input terminal, a second input terminal, and an output terminal;
- the ring counter comprises N stages of third latches coupled in cascade, each of the N stages of third latches comprising a first input terminal, a second input terminal, and an output terminal, and an $n^{th}$ stage of third latch in the N stages of third latches is configured to control P switching circuits;
- an effective pulse edge of a clock signal received by a second input terminal of the $n^{th}$ stage of third latch differs from an effective pulse edge of a clock signal received by a second input terminal of the $(n+1)^{th}$ stage of third latch by a second set time;
- an output terminal of the $n^{th}$ stage of third latch is electrically coupled to a first input terminal of the $(n+1)^{th}$ stage of third latch, and second input terminals of the P switching circuits controlled by the $n^{th}$ stage of third latch;
- an output terminal of a $p^{th}$ switching circuit in the P switching circuits controlled by the $n^{th}$ stage of third latch is electrically coupled to a second input terminal of the $n^{th}$ latch array in the N latch arrays in the $p^{th}$ latch array group;
- a first input terminal of the switching circuit is configured to receive a clock signal; and
- effective pulse edges of two clock signals received by first input terminals of any two adjacent switching circuits differ from each other by a third set time;
- wherein n is an integer greater than or equal to 1 and less than or equal to N.

8. The output control circuit according to claim 7, wherein at least one of the first latch, the second latch, and the third latch is a D-type latch.

9. A method for transmitting data, comprising:
- transmitting serial data to be transmitted to the output control circuit according to claim 1, wherein:
- the serial-to-parallel conversion circuit performs a serial-to-parallel conversion on the serial data to obtain at least one group of parallel data;
- the intermediate-stage cache circuit receives the at least one group of parallel data, and divides the at least one group of parallel data into at least two categories of subgroup parallel data according to sequence of serial-to-parallel conversion in the serial-to-parallel conversion circuit, and caches the at least two categories of subgroup parallel data;
- each of the plurality of latch arrays receives any one of the at least two categories of subgroup parallel data; and
- the selection control circuit controls a latch array for the any subgroup parallel data in the plurality of latch arrays to latch and output the any subgroup parallel data within effective pulse duration of the any subgroup parallel data in any category of subgroup parallel data.

10. An electronic device comprising the output control circuit according to claim 1.

* * * * *